(12) United States Patent
Oooka et al.

(10) Patent No.: US 9,231,036 B2
(45) Date of Patent: Jan. 5, 2016

(54) ORGANIC ELECTROLUMINESCENCE DISPLAY DEVICE

(71) Applicant: Japan Display Inc., Tokyo (JP)

(72) Inventors: Hiroshi Oooka, Tokyo (JP); Mitsuhide Miyamoto, Tokyo (JP)

(73) Assignee: JAPAN DISPLAY INC, Tokyo (JP)

( * ) Notice: Subject to any disclaimer, the term of this patent is extended or adjusted under 35 U.S.C. 154(b) by 0 days.

(21) Appl. No.: 14/207,765

(22) Filed: Mar. 13, 2014

(65) Prior Publication Data

US 2014/0284572 A1 Sep. 25, 2014

(30) Foreign Application Priority Data

Mar. 22, 2013 (JP) ................................. 2013-060351

(51) Int. Cl.
*H01L 27/32* (2006.01)
*H01L 51/52* (2006.01)

(52) U.S. Cl.
CPC ........ *H01L 27/3246* (2013.01); *H01L 27/3276* (2013.01); *H01L 51/525* (2013.01); *H01L 51/5284* (2013.01)

(58) Field of Classification Search
CPC ............ H01L 27/3246; H01L 27/3248; H01L 51/5012
USPC ........................................ 257/40, 72; 345/76
See application file for complete search history.

(56) References Cited

U.S. PATENT DOCUMENTS

| 2001/0043046 | A1 | 11/2001 | Fukunaga |
| 2005/0001963 | A1* | 1/2005 | Yokoyama ..................... 349/122 |
| 2005/0212413 | A1* | 9/2005 | Matsuura et al. ............. 313/504 |
| 2006/0279491 | A1* | 12/2006 | Ozawa et al. ................... 345/76 |
| 2011/0279014 | A1* | 11/2011 | Winters et al. ................ 313/500 |

FOREIGN PATENT DOCUMENTS

| JP | 2002-33198 | 1/2002 |
| JP | 2006-278241 | 10/2006 |
| JP | 2009-128671 | 6/2009 |

* cited by examiner

*Primary Examiner* — Earl Taylor
(74) *Attorney, Agent, or Firm* — Lowe Hauptman & Ham, LLP

(57) ABSTRACT

Provided is an organic electroluminescence display device. The organic electroluminescence display device includes a bank that is provided so as to surround a central portion of a pixel electrode, an organic electroluminescence layer that is provided on the pixel electrode, a common electrode that is formed so as to extend from the organic electroluminescence layer to the bank, a color filter layer that overlaps the organic electroluminescence layer, a black matrix layer that overlaps the bank, a spacer that is provided on the black matrix layer, and a wiring that is provided on the black matrix layer so as to be placed on the spacer. The black matrix layer is disposed on the bank through the spacer. A convex portion is formed by the wiring being placed on the spacer, and the convex portion is electrically connected to the common electrode above the bank.

8 Claims, 3 Drawing Sheets

ORGANIC ELECTROLUMINESCENCE DISPLAY DEVICE

CROSS-REFERENCE TO RELATED APPLICATION

The present application claims priority from Japanese application JP2013-60351 filed on Mar. 22, 2013, the content of which is hereby incorporated by reference into this application.

BACKGROUND OF THE INVENTION

1. Field of the Invention

The present invention relates to an organic electroluminescence display device.

2. Description of the Related Art

In top-emission type organic electroluminescence display devices, light is extracted from a negative electrode, and thus the negative electrode is required to be high in light transmittance from the perspective of improvement of light extraction efficiency. Meanwhile, a negative electrode is also required to be high in conductivity from the perspective of low power consumption.

Transparent oxide semiconductor films are generally used as negative electrodes, but an increase in thickness of the transparent oxide semiconductor film is essential to reduce sheet resistance, and transmittance is reduced. Light transmittance and conductivity have a trade-off relationship with each other, and thus it is difficult to satisfy both of them.

When a combination of a transparent oxide semiconductor film and a metal thin film having high conductivity is used, the influence of a light interference effect by the reflection of a metal thin film is great, and thus it becomes difficult to adjust a luminescent color.

When a metal film having high conductivity is formed in a non-emission region, a pixel aperture is not reduced in size, but a higher film formation accuracy than that of the pixel aperture is required, and thus application in production is difficult. For example, it is possible to form a minute auxiliary wiring on a transparent conductive film by deposition using a shadow mask, but a film formation region becomes narrower than a pixel. Thus, a highly accurate mask manufacturing technique and film formation technique are required, which results in a difficulty in practical application.

JP 2002-33198 A or JP 2006-278241 A discloses that an organic layer and a negative electrode are formed on a thin film transistor (TFT) substrate, an adhesion layer is formed on an encapsulation substrate for encapsulating the organic layer, an auxiliary wiring is formed on the adhesion layer, and the encapsulation substrate is bonded to the TFT substrate so that the auxiliary wiring faces a negative electrode. Meanwhile, the auxiliary wiring is pushed into the adhesion layer, and thus the auxiliary wiring and the negative electrode come into contact with each other. In this example, since the auxiliary wiring is formed on the adhesion layer, there is a problem in that a material is limited for a reason that the formation has to be performed without thermal curing.

JP 2009-128671 A discloses that a transparent conductive film is formed on an encapsulation substrate, and the encapsulation substrate is bonded to a TFT substrate, thereby bringing the transparent conductive film into contact with a negative electrode on the TFT substrate. However, since the transparent conductive film covers an emission region, a decrease in light transmittance is inevitable.

SUMMARY OF THE INVENTION

An object of the present invention is to satisfy both high light transmittance and high conductivity.

(1) An organic electroluminescence display device according to the present invention includes a plurality of pixel electrodes; a bank that is provided so as to surround at least a central portion of each of the pixel electrodes; an organic electroluminescence layer that is provided on the plurality of pixel electrodes; a common electrode which has light transmittance and is formed so as to extend from the organic electroluminescence layer to the bank; a black matrix layer that overlaps the bank; a spacer that is provided on the black matrix layer; and a wiring that is provided on the black matrix layer, a part of the wiring being placed on the spacer. The black matrix layer is disposed on the bank through the spacer. The wiring has a convex portion formed by the part of the wiring being placed on the spacer, and the convex portion is electrically connected to the common electrode above the bank. According to the present invention, the entire conductivity of the wiring and the common electrode which are electrically connected to each other is higher than the conductivity of the common electrode. In addition, since the wiring is formed so as to overlap the black matrix layer, the wiring does not interfere with light transmission. Therefore, it is possible to satisfy both high light transmittance and high conductivity.

(2) The organic electroluminescence display device according to (1) may further include an insulating layer that is present below the plurality of pixel electrodes; a plurality of thin film transistors that are present below the insulating layer; and a contact that passes through the insulating layer below the bank to electrically connect each of the pixel electrodes to each of the thin film transistors. The plurality of pixel electrodes may include a group constituted by two or more of the pixel electrodes that are adjacent to each other. The contacts included in the pixel electrodes of the group may be disposed so as to be adjacent to each other. The bank may have a coating portion that continuously covers two or more of the contacts. The spacer may be located on the coating portion. The convex portion of the wiring may be electrically connected to the common electrode above the coating portion.

(3) In the organic electroluminescence display device according to (2), the group may be constituted by four of the pixel electrodes, and the contacts included in the four of the pixel electrodes may be disposed so as to surround the spacer when seen in a plan view.

(4) The organic electroluminescence display device according to (2) may further include a first substrate, and a second substrate facing the first substrate. The organic electroluminescence layer, the plurality of pixel electrodes, the common electrode, the bank, and the plurality of thin film transistors may be formed in the first substrate. The black matrix layer, the spacer, and the wiring may be formed in the second substrate.

(5) In the organic electroluminescence display device according to (1), the organic electroluminescence layer may be configured to emit white light.

(6) The organic electroluminescence display device according to (1) may further include a color filter layer overlapping the organic electroluminescence layer.

(7) In the organic electroluminescence display device according to (6), a space may be formed between the organic electroluminescence layer and the color filter layer.

(8) The organic electroluminescence display device according to (1) may further include a first substrate, and a second substrate facing the first substrate. The organic electroluminescence layer, the plurality of pixel electrodes, the common electrode, and the bank may be formed in the first substrate. The black matrix layer, the spacer, and the wiring may be formed in the second substrate.

DETAILED DESCRIPTION OF THE INVENTION

Figure 1:
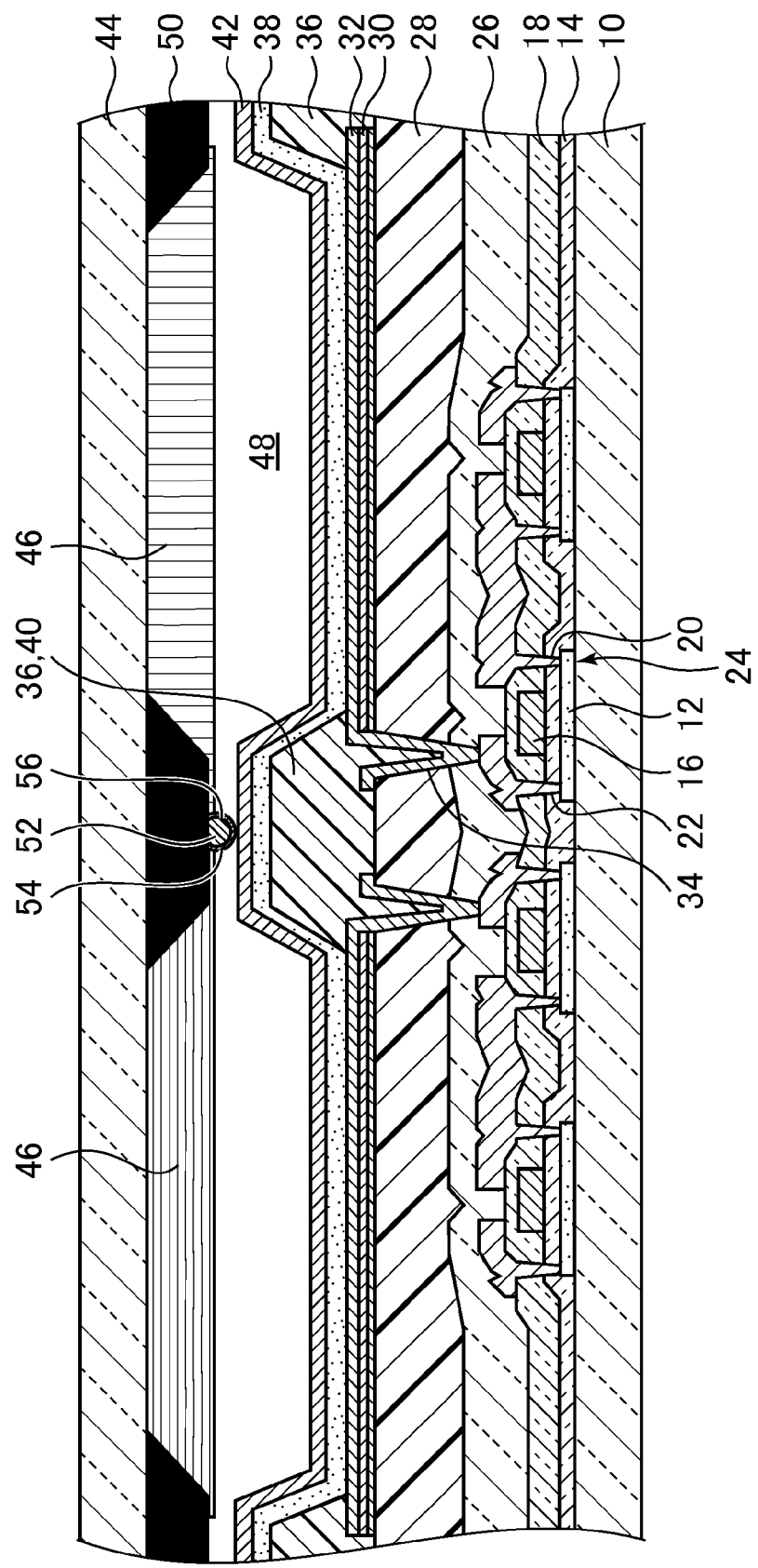
FIG. 1 is a cross-sectional view of an organic electroluminescence display device according to an embodiment of the present invention.

Hereinafter, an embodiment of the present invention will be described with reference to the accompanying drawings.
FIG. 1 is a plan view of an organic electroluminescence display device according to an embodiment of the present invention. The organic electroluminescence display device includes a first substrate 10 which has light transmittance and is formed of glass or the like. A semiconductor layer 12 is formed on the first substrate 10. A gate insulating film 14 is formed so as to cover the semiconductor layer 12. A gate electrode 16 is formed on the gate insulating film 14, and an interlayer insulating film 18 is formed so as to cover the gate electrode 16. A source electrode 20 and a drain electrode 22 are provided so as to pass through the interlayer insulating film 18 to reach the semiconductor layer 12. The semiconductor layer 12, the source electrode 20, the drain electrode 22, and the gate electrode 16 are components of a thin film transistor 24.

A passivation film 26 is formed on the interlayer insulating film 18 so as to cover the source electrode 20 and the drain electrode 22, and an insulating layer 28 is provided thereon. A light reflection layer 30 for reflecting light is formed on the insulating layer 28.

A pixel electrode 32 (for example, a positive electrode) is provided on the light reflection layer 30. The pixel electrode 32 passes through the insulating layer 28 to be electrically connected to one of the source electrode 20 and the drain electrode 22. The insulating layer 28 is present below the plurality of pixel electrodes 32, and the plurality of thin film transistors 24 are present below the insulating layer 28.

Figure 2:
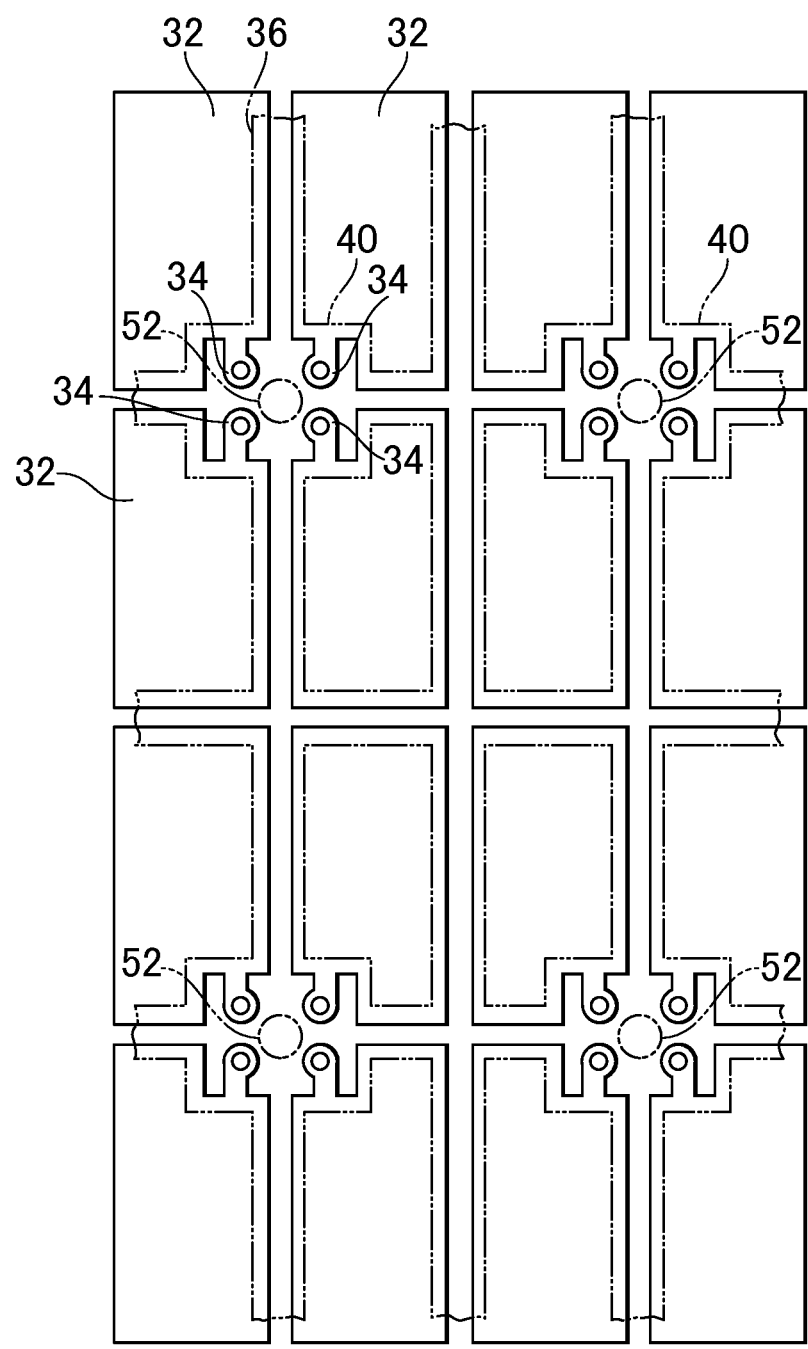
FIG. 2 is a diagram illustrating a pixel electrode.

FIG. 2 is a diagram illustrating the pixel electrode 32. The organic electroluminescence display device has the plurality of pixel electrodes 32 which are separated from each other. Each of the pixel electrodes 32 is electrically connected to any one of the thin film transistors 24 by a contact 34 passing through the insulating layer 28. The contacts 34 included in the respective adjacent pixel electrodes 32 are disposed so as to be adjacent to each other. In other words, the plurality of contacts 34 are gathered in one place.

A bank 36 formed of an insulator such as a resin is provided so as to surround at least a central portion of each of the pixel electrodes 32. As illustrated in FIG. 1, an organic electroluminescence layer 38 is formed on the pixel electrodes 32 surrounded by the bank 36. A portion of the organic electroluminescence layer 38 is also placed on the bank 36. As illustrated in FIG. 2, the bank 36 has a coating portion 40 that continuously covers two or more adjacent contacts 34.

The organic electroluminescence layer 38 includes at least a light emitting layer, and further includes at least one of an electron transport layer, a hole transport layer, an electron injection layer, and a hole injection layer. At least one layer constituting the organic electroluminescence layer 38 is formed of an organic material. The organic electroluminescence layer 38 is formed by deposition or sputtering. The organic electroluminescence layer 38 is configured so as to emit white light through color mixture by superimposing a plurality of light emitting layers emitting different colors.

A common electrode 42 having light transmittance is formed so as to extend from the organic electroluminescence layer 38 to the bank 36. The common electrode 42 is formed so as to cover all the pixel electrodes 32. The organic electroluminescence layer 38 is disposed between the pixel electrode 32 and the common electrode 42. A voltage is applied to the pixel electrode 32 and the common electrode 42 to inject holes and electrons into the organic electroluminescence layer 38 from the pixel electrode and the common electrode, respectively. The injected holes and electrons are coupled to each other in the light emitting layer to emit light.

The organic electroluminescence display device includes a second substrate 44 which has light transmittance and is formed of glass or the like. The second substrate 44 is disposed so as to face the first substrate 10 at an interval. A color filter layer 46 is provided on a surface of the second substrate 44 on the first substrate 10 side. The color filter layer 46 overlaps the organic electroluminescence layer 38. A space 48 is formed between the organic electroluminescence layer 38 and the color filter layer 46. In other words, hollow sealing is applied. As a modified example, the space 48 may be filled with a resin. A black matrix layer 50 is formed on a surface of the second substrate 44 on the first substrate 10 side.

Figure 3:
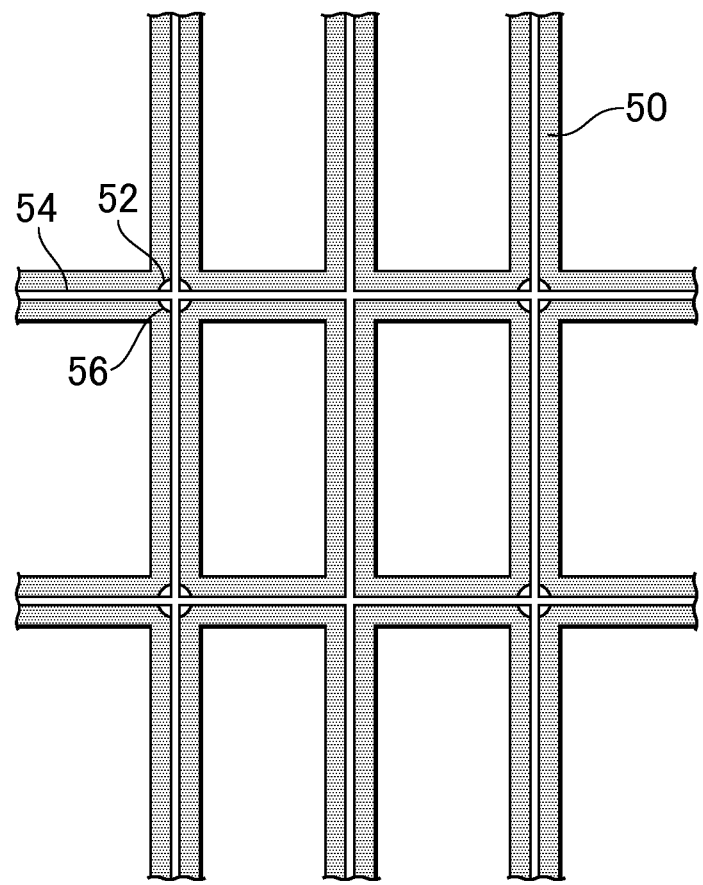
FIG. 3 is a diagram illustrating a black matrix layer.

FIG. 3 is a diagram illustrating the black matrix layer 50. A spacer 52 is provided on the black matrix layer 50. A wiring 54 is provided on the black matrix layer 50 so as to be placed on the spacer 52. By the wiring 54 being placed on the spacer 52, a convex portion 56 is formed. Since the wiring 54 is formed on the black matrix layer 50 on the second substrate 44, a photo process or a baking process can be applied, and there is a wide range of choices for a material.

A manufacturing process includes forming the black matrix layer 50 on one surface of the second substrate 44, forming the black matrix layer 50 on the same surface, providing the spacer 52 on the black matrix layer 50 on the same side, and forming the wiring 54, in this order.

As illustrated in FIG. 1 and FIG. 2, the black matrix layer 50 overlaps the bank 36. The black matrix layer 50 is disposed on the bank 36 through the spacer 52. By the presence of the spacer 52, a gap is formed between the black matrix layer 50 and the bank 36, but the size of the gap is uniformized. In addition, by the presence of the spacer 52, the gap is increased in size in spite of the presence of external substances between the organic electroluminescence layer 38 and the color filter layer 46, and thus the organic electroluminescence layer 38 is not crushed.

The convex portion 56 of the wiring 54 is electrically connected to the common electrode 42 above the bank 36. By the presence of the convex portion 56, the wiring 54 and the common electrode 42 can stably come into contact with each other. As a modified example, when the space 48 illustrated in FIG. 1 is filled with a resin, even if an upper surface of the common electrode 42 is covered by the resin, the convex portion 56 is pushed into the resin to be brought into contact with the common electrode 42. The coating portion 40 of the bank 36 is large in width as the coating portion continuously covers two or more contacts 34, and thus the spacer 52 is located thereon. The convex portion 56 of the wiring 54 is electrically connected to the common electrode 42 above the coating portion 40.

According to this embodiment, the entire conductivity of the wiring 54 and the common electrode 42 that are electrically connected to each other is higher than the conductivity of the common electrode 42. In addition, since the wiring 54 is formed so as to overlap the black matrix layer 50 and not to protrude, the wiring does not interfere with light transmission. Therefore, it is possible to satisfy both high light transmittance and high conductivity.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An organic electroluminescence display device comprising:
   a plurality of pixel electrodes;
   a bank that is provided so as to surround at least a central portion of each of the pixel electrodes;
   an organic electroluminescence layer that is provided on the plurality of pixel electrodes;
   a common electrode which has light transmittance and is provided on the organic electroluminescence layer, the common electrode overlapping with the organic electroluminescence layer, the bank, and the plurality of pixel electrodes;
   a black matrix layer that overlaps the bank, the black matrix layer having a first width perpendicular to an extending direction;
   a spacer that is provided on the black matrix layer; and
   a wiring that is provided on the black matrix layer, the wiring having a second width perpendicular to an extending direction, a part of the wiring being placed on the spacer,
   wherein the first width of the black matrix layer is wider than the second width of the wiring such that the wiring does not spread out of a region overlapping with the black matrix layer,
   wherein the black matrix layer is disposed on the bank through the spacer,
   wherein the wiring has a projection formed by the part of the wiring being placed on the spacer, and the projection is electrically connected to the common electrode above the bank,
   wherein the wiring extends in two directions to form a first reticular pattern having first intersections,
   wherein the black matrix layer extends in two directions to form a second reticular pattern having second intersections,
   wherein the first intersections overlap with the respective second intersections,
   wherein the projection of the wiring on the spacer overlaps with a first couple of one of the first intersections and one of the second intersections, overlapping with each other, and
   a second couple of one of the first intersections and one of the second intersections, overlapping with each other, do not overlap with the projection of the wiring on the spacer.

2. The organic electroluminescence display device according to claim 1, further comprising:
   an insulating layer that is present below the plurality of pixel electrodes;
   a plurality of thin film transistors that are present below the insulating layer; and
   a contact that passes through the insulating layer below the bank to electrically connect each of the pixel electrodes to each of the thin film transistors, wherein the plurality of pixel electrodes include a group constituted by two or more of the pixel electrodes that are adjacent to each other, wherein the contacts included in the pixel electrodes of the group are disposed so as to be adjacent to each other, wherein the bank has a coating portion that continuously covers two or more of the contacts, and wherein the spacer is located on the coating portion, and the projection of the wiring is electrically connected to the common electrode above the coating portion.

3. The organic electroluminescence display device according to claim 2, wherein the group is constituted by four of the pixel electrodes, and wherein the contacts included in the four of the pixel electrodes are disposed so as to surround the spacer when seen in a plan view.

4. The organic electroluminescence display device according to claim 2, further comprising a first substrate, and a second substrate facing the first substrate, wherein the organic electroluminescence layer, the plurality of pixel electrodes, the common electrode, the bank, and the plurality of thin film transistors are formed in the first substrate, and wherein the black matrix layer, the spacer, and the wiring are formed in the second substrate.

5. The organic electroluminescence display device according to claim 1, wherein the organic electroluminescence layer is configured to emit white light.

6. The organic electroluminescence display device according to claim 1, further comprising a color filter layer overlapping the organic electroluminescence layer.

7. The organic electroluminescence display device according to claim 6, wherein a space is formed between the organic electroluminescence layer and the color filter layer.

8. The organic electroluminescence display device according to claim 1, further comprising a first substrate, and a second substrate facing the first substrate, wherein the organic electroluminescence layer, the plurality of pixel electrodes, the common electrode, and the bank are formed in the first substrate, and wherein the black matrix layer, the spacer, and the wiring are formed in the second substrate.

* * * * *